United States Patent [19]

Evans

[11] 4,065,682
[45] Dec. 27, 1977

[54] LOGARITHMIC CONVERTER

[75] Inventor: Ronald C. Evans, Binghamton, N.Y.

[73] Assignee: McIntosh Laboratory, Inc., Binghamton, N.Y.

[21] Appl. No.: 669,134

[22] Filed: Mar. 22, 1976

[51] Int. Cl.² ............ H02M 7/00; G06G 7/24; G01R 19/04

[52] U.S. Cl. .................... 307/261; 307/230; 307/351; 324/103 P; 324/132; 328/26; 328/145; 328/151

[58] Field of Search ............ 307/229, 230, 235 A, 307/261, 262; 321/8 R; 328/26, 145, 150, 151; 324/76 A, 103 P, 111, 119, 120, 123 C, 132

[56] References Cited

U.S. PATENT DOCUMENTS

| | | | |
|---|---|---|---|
| 3,099,000 | 7/1963 | Dunning | 307/235 N |
| 3,201,688 | 8/1965 | Ferguson | 324/111 X |
| 3,289,079 | 11/1966 | Ferguson | 324/111 X |
| 3,499,160 | 3/1970 | Gordon | 328/145 X |
| 3,971,984 | 7/1976 | Bench | 328/145 X |

*Primary Examiner*—John Zazworsky

*Attorney, Agent, or Firm*—Pollock, Vande Sande & Priddy

[57] ABSTRACT

A system for deriving a voltage which is a logarithmic function of peak value of an audio signal, in which the audio input signal is amplified by means of an operational amplifier having bipolar feedbacks through a pair of oppositely poled rectifying junction devices operating over logarithmic portions of their response characteristics, the output of the operational amplifier being applied in opposite polarities to a second pair of rectifying junction devices to rectify a bipolar signal applied thereto, and to control current flow to a storage capacitor, the second pair of devices having a common load which provides a constant current source for slow charge of the storage capacitor in one sense, the second pair of devices providing rapid discharge paths in the opposite sense. In one embodiment either or both pairs of rectifying junction devices can be transistors. Improved operation occurs with transistors in that they exhibit gain as well as rectifying characteristics which increases the range of the inventive circuit.

14 Claims, 1 Drawing Figure

U.S. Patent     Dec. 27, 1977     4,065,682
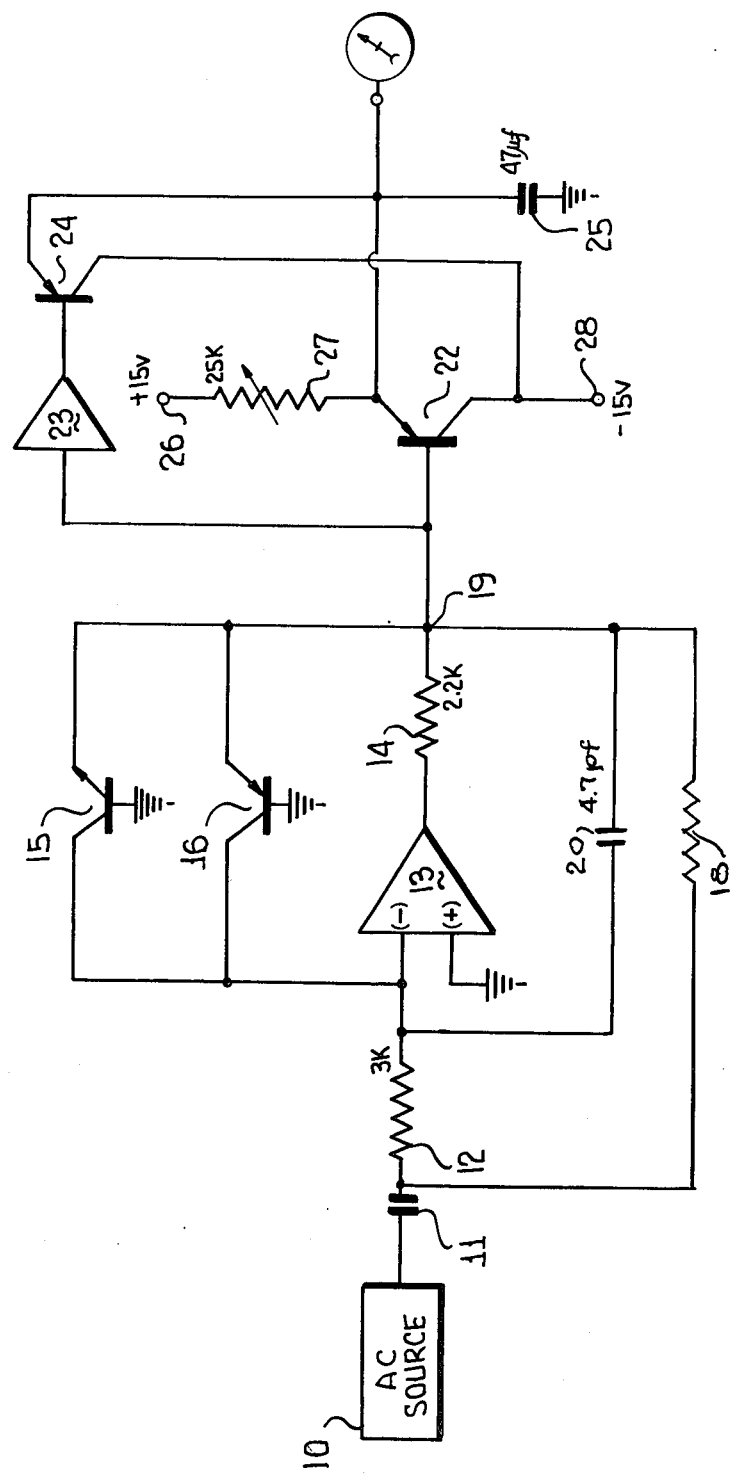

LOGARITHMIC CONVERTER

BACKGROUND OF THE INVENTION

It is well known to provide circuitry for measuring rms value of a bipolar wide band audio input signal, as a logarithmic function. An example of such a circuit is that of U.S. Pat. to Blackmer, No. 3,681,618. It is also well known to measure peak values of an audio signal which varies rapidly in amplitude over extremely wide ranges. Such systems usually provide linear responses, or if they provide logarithmic responses are extremely complex and therefore costly. It is an object of the present invention to provide an electronic peak rectifying system which is economical to fabricate, requiring only four discrete rectifying junction devices, some or all of which may be transistors, one operational amplifier and an inverter, yet which provides a logarithmic response representing peak voltage at the input of the system. Such a peak rectifying system finds utility in a meter as well as in other applications.

The operational requirements of a peak reading meter are quite distinct from those of an rms meter. A peak reading meter must respond rapidly to a rapidly increasing voltage, but must hold its reading if the voltage rapidly decreases, i.e., it is not enough to integrate voltages, or to average voltages.

The present system employs a logarithmic amplifier which is in a broad sense known, as in the Blackmer patent, but which includes improvements over the latter. The system also includes a simple device, requiring only two rectifying junction devices, which may be transistors and an inverter which can charge a capacitor slowly from a fixed voltage source via a large resistance, representing a constant current source, and can discharge the capacitor rapidly, the actions taking place in response to voltages of either polarily.

SUMMARY OF THE INVENTION

A logarithmic bipolar amplifier driving a pair of half wave rectifying junction devices, which may be transistors which control slow charge of a storage capacitor from a constant current source, and rapid discharge of the capacitor which need include no resistance.

DESCRIPTION OF THE DRAWINGS

The single FIGURE is a schematic circuit diagram of a system according to the invention.

DETAILED DESCRIPTION

Ten is a low impedance source of wide band audio signal. Source 10 is coupled via a capacitor 11 and a resistance 12 to an input terminal of an operational amplifier 13, which is of itself linear. Resistance 12 is a voltage to current converter so a current flows into the input terminal in response to the a.c. input voltage. The output terminal of operational amplifier 13 is connected via a current limiting resistance 14 to emitters of NPN transistor 15 and PNP transistor 16. The transistors 15 and 16 have grounded bases and have collectors connected directly to the input terminal of operational amplifier 13. The transistors 15 and 16 operate to translate input voltage (on their emitters) to output current (at their collectors) on an anti-logarithmic basis, but because they are of opposite conductivity types feed back currents of opposite polarities to the input of operational amplifier 13.

A fixed resistance 18 is connected between point 19 at the output of amplifier 13 to the connection of capacitor 11 and resistance 12. The amplifier is an inverting amplifier, so that resistance 18 provides a dc feedback path and maintains the output of the amplifier normally at zero volts dc. Small feedback capacitor 20 removes very high frequency signals from point 19 by providing an ac feedback path. Its value is so small (4.7 p.f.) that the audio band is not materially affected.

Point 19 is directly connected to the base of transistor 22, and via inverting operational amplifier 23 to the base of transistor 24. Transistors 22 and 24 are both PNP types, and have their emitters directly connected to storage capacitor 25. The emitters of the transistors 22 and 24 are also connected to positive voltage terminal 26 via resistance 27 (25.K), which in effect forms a current source from the +15v supply. The collectors are connected to negative voltage terminal 28 (−15v).

The voltage at point 19 is bipolar, about zero, but is logarithmically related to the current into operational amplifier 13. Transistors 22 and 24 are so selected that with zero volts on their base, with their emitters connected to +15v via a 25.K resistance 27, and with their emitters connected to capacitor 25, the voltage across capacitor 25 is at a very slightly positive voltage above ground determined by the base to emitter voltage of transistors 22 and 24. If a negative current flows out of point 19 (that is, toward resistance 14) the transistor 22 becomes more conductive and pulls down the voltage of capacitor 25, but transistor 24 is now cut off and cannot affect flow to the capacitor 25. If a positive current flows out of point 19, transistor 24 becomes more conductive and again pulls down the voltage of capacitor 25 and transistor 22 is cut off. Thus, in response to increase of input signal to the system of either polarity, the storage capacitor 25 acquires, rapidly, a logarithmically related less positive voltage.

The capacitor 25 can recharge in a positive direction only through resistance 27. A substantial time constant is involved so that the capacitor tends to hold its less positive voltage once acquired. This time constant is in part that due to resistance 27 and capacitor 25, considered as an RC series circuit. But, so long as either of transistors 22, 24 is conductive it tends to drain current from resistance 27 or, looked at in another way, from the capacitor 25 while it is being charged via resistance 27, increasing the net effective time constant.

The charge on capacitor 25, or its voltage, may be visually transduced, as by a meter of any type which does not involve a current drain from capacitor 25. The voltage represents maximum peaks of either polarity supplied by source 10, but because of the interposition of operational amplifier 13 and its non-linear feedback circuits, the indication is logarithmic, and not linear. The rectifier-amplifier including transistors 22, 24 is of general application, and can be employed in a linear peak voltage indicating system.

As indicated above, the pairs of transistors 15–16 and/or 22–24 can be replaced by rectifying junction devices poled similarly to the base emitter junction of the respective transistor. Such other devices include diodes and other bipolar devices. Of course, such replacement would be at the expense of the gain contributed by the replaced transistor and would reduce the range of the system. With the circuit parameters as disclosed the range of the system is at least 100 db. whereas with diodes the range may be reduced to 80–90 db.

If the peak rectifying system is not applied to drive a meter the output may be taken from capacitor 25 to drive a high impedance (low current drain) load.

What I claim is:

1. A peak rectifying system for an AC signal comprising an amplifier of said signal, said amplifier having a bipolar output, a bipolar circuit including a first transistor and a second transistor, means biasing said transistors approximately to cut-off, a storage capacitor directly connected
   to an electrode of said first transistor in a collector-emitter circuit thereof,
   to a corresponding electrode of said second transistor in a collector-emitter circuit thereof, and
   to a ground, a source of constant current of one polarity connected to both said corresponding electrodes, and a source of voltage of polarity opposite said one polarity connected to other electrodes in collector-emitter circuits of said transistors, whereby a peak rectified signal is available at said storage capacitor.

2. The combination according to claim 1, wherein said amplifier of said signal has a logarithmic response.

3. The combination according to claim 2, wherein said amplifier of said signal includes an operational amplifier having bipolar logarithmic feedback circuits.

4. The combination according to claim 1, wherein said transistors are PNP transistors, means connecting the output of said amplifier directly to one of the bases of said transistors, and via an inverter to the other of the bases of said transistors, said transistors each including an emitter and a collector, said corresponding electrodes being said emitters and said source of constant current including a positive voltage source, said source of constant current further including resistance connected between said positive voltage source and said emitters.

5. In combination, a source of wide-band audio signal rapidly varying in amplitude, a logarithmic operational amplifier having an input connected to said source, an amplifying full wave rectifier means connected to the output of said amplifier, a storage capacitor connected as a load for said amplifying full wave rectifier means, said amplifying full wave rectifier means including means for rapidly increasing the charge on said capacitor in one sense in response to an increase in said wide band audio signal amplitude and means for slowly decreasing said charge in response to a decrease in said wide band audio signal amplitude.

6. The combination according to claim 5, wherein said amplifying full wave rectifier means includes two transistors of the same conductivity type connected with identical electrodes connected in parallel to one terminal of said storage capacitor, means biasing said transistors approximately to cut-off, and means driving said transistors in opposite polarities from said operational amplifier.

7. The combination of claim 6 which further includes a visual voltage transducer connected to said storage capacitor.

8. A peak signal meter comprising an operational amplifier of said signal having a feedback circuit including a pair of oppositely poled rectifying junction devices, a bipolar full wave rectifying circuit connected in cascade with said amplifier including first and second multiterminal rectifying junction devices, a storage capacitor connected between a corresponding terminal of said first and second devices and ground, other terminals of said first and second devices responsive to said operational amplifier output, and a visual voltage transducing means connected to said storage capacitor.

9. Meter of claim 8 wherein said pair of oppositely poled devices are transistors.

10. The meter of claim 8 in which said first and second rectifying junction devices are PNP transistors, in which said corresponding terminals are emitters and said other terminals and bases.

11. The meter of claim 10 which further includes constant current source means connected to said emitters of said PNP transistors.

12. The meter of claim 8 in which one of said other terminals is connected to said operational amplifier output and the other connected thereto via an inverter.

13. The meter of claim 12 in which said first and second rectifying junction devices are PNP transistors with said corresponding terminals comprising emitters and said other terminals comprising bases.

14. The meter of claim 13 which further includes constant current source means connected to said emitters of said PNP transistors.

* * * * *